(12) United States Patent
Martins

(10) Patent No.: US 6,504,435 B1
(45) Date of Patent: Jan. 7, 2003

(54) FEEDBACK CLAMP CIRCUIT TO PREVENT OVERCHARGE IN COMPENSATION CAPACITOR

(75) Inventor: Marcus Marchesi Martins, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 09/652,080

(22) Filed: Aug. 31, 2000

(51) Int. Cl.$^7$ .................................................. H03F 1/14
(52) U.S. Cl. ........................................ 330/292; 330/311
(58) Field of Search ................................ 330/107, 292, 330/311; 327/318, 319

(56) References Cited

U.S. PATENT DOCUMENTS

| | | | | |
|---|---|---|---|---|
| 5,315,264 A | * | 5/1994 | Sundby | 330/253 |
| 5,517,159 A | | 5/1996 | Hwang | 332/127 |
| RE35,261 E | | 6/1996 | Nelson | 330/257 |
| 5,877,654 A | * | 3/1999 | Fong et al. | 330/292 |
| 6,049,355 A | | 4/2000 | Kameyama | 348/241 |
| 6,201,442 B1 | * | 3/2001 | James et al. | 330/107 |

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

The present invention provides a dual stage amplifier with a clamping circuit and a methodology, along with a clamping circuit for use with a dual stage amplifier, which eliminate or reduce the overcharging of a compensation capacitor in such a dual stage amplifier. The amplifier includes a first amplifier stage with a first input and a first output, a second amplifier stage having a second input operatively connected to the first output, and a second output. The amplifier further includes a compensation capacitor in electrical communication with the second input and the second output, and a clamping circuit in electrical communication with the second stage, which is adapted to prevent overcharging of the compensation capacitor. The clamping circuit may include a low vgs clamp, a high vgs clamp, and/or a combination low and high vgs clamp, wherein the low vgs clamp is adapted to bias the second input away from a negative supply, and the high vgs clamp is adapted to bias the second input away from a positive supply.

21 Claims, 5 Drawing Sheets

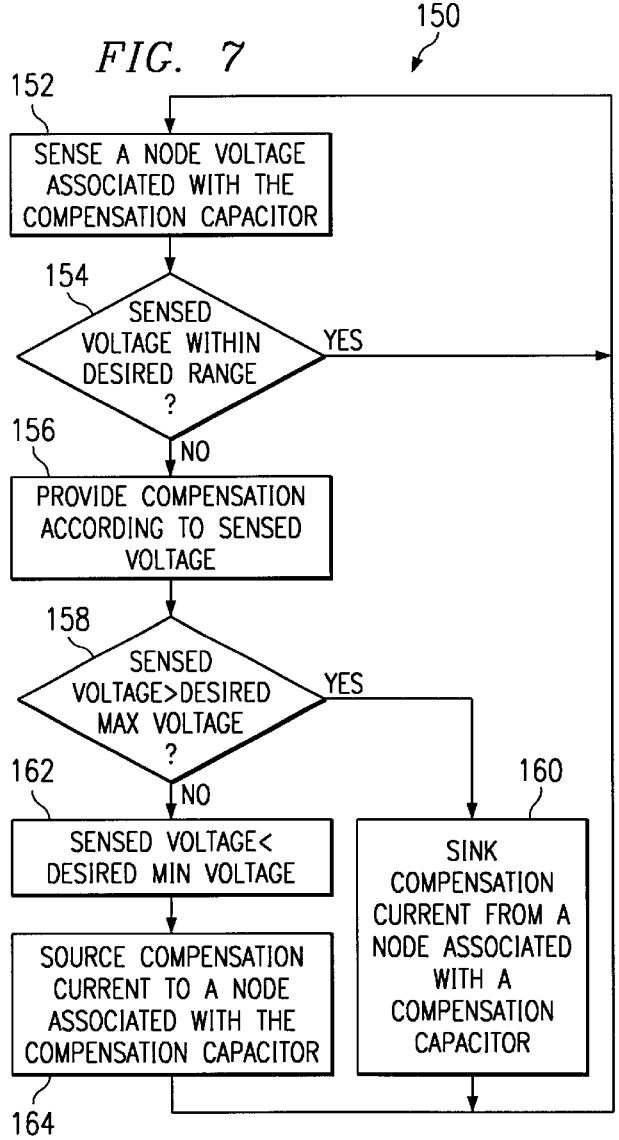
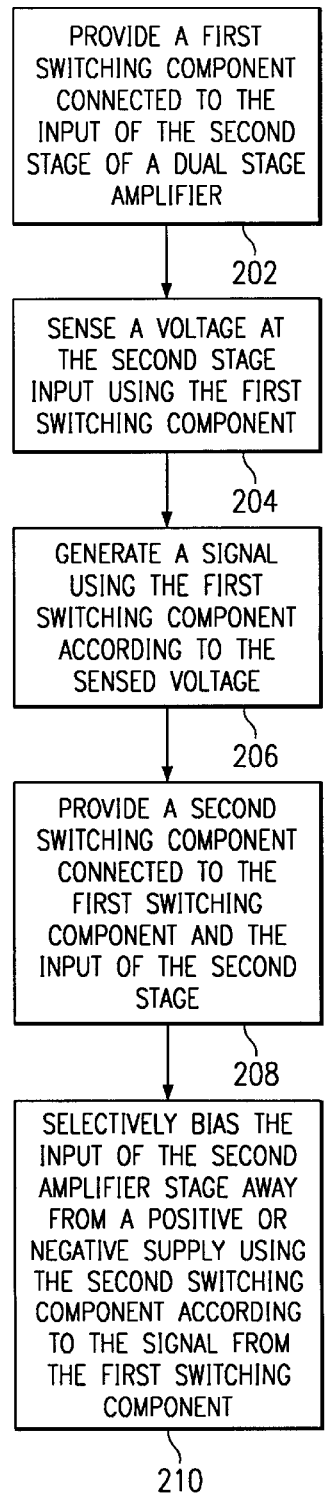

FEEDBACK CLAMP CIRCUIT TO PREVENT OVERCHARGE IN COMPENSATION CAPACITOR

TECHNICAL FIELD

This invention relates generally to dual stage amplifiers, and more particularly to a dual stage amplifier with a clamp circuit for preventing overcharge in a compensation capacitor.

BACKGROUND OF THE INVENTION

Dual stage amplifier circuits are used in a variety of applications. Such circuits may include a differential input first amplifier stage with a second stage having an output related to the difference between the terminals of the first amplifier stage. A compensation capacitor is sometimes employed between the input and output of the second amplifier stage, in order to compensate for instability in the dual stage circuit. The size of such a compensation capacitor may be varied according to the desired frequency response characteristics of the circuit. Thus, where the bandwidth of the dual stage amplifier needs to be reduced, the compensation capacitor may be relatively large. For example, where a dual stage amplifier is used as an error amplifier in a switching regulator, it may be desirable to reduce the dual stage error amplifier bandwidth below the switching frequency of the switching regulator.

In addition to stability, the response time of the output may be an important performance characteristic of a dual stage amplifier. Where a compensation capacitor is employed between the input and output of the second amplifier stage, overcharging of the compensation capacitor may lead to unacceptably long output response times in the dual stage amplifier as well as undesirable overshoot in the output of a switching regulator or other closed loop system in which the dual stage amplifier is employed as an error amplifier. Such overcharging of the compensation capacitor may occur when the differential input terminals are imbalanced, such as during power up when the terminals are in indeterminate states. For example, in a switching regulator, a dual stage error amplifier may have a positive differential input terminal connected to a reference voltage source, and a negative differential input terminal connected to the regulated output through a resistive voltage divider network. Due to internal timing of the switching regulator, the reference voltage source may rise to its steady state voltage faster than does the regulated output. Thus, an imbalance occurs at the differential inputs, where the positive terminal is at the reference voltage and the negative terminal is near zero volts.

Such an imbalance at the dual stage amplifier inputs may cause the second stage input to go to one of the power supply rails or to ground in a single-ended configuration. Where the second amplifier stage is an inverter, such as a MOS transistor with a drain connected to the error amplifier output and a gate connected to the second stage input, the compensation capacitor may be connected in a feedback path between the drain and gate of the transistor. Excessive charging of the compensation capacitor may thus occur where an input imbalance condition causes the second stage input to go to ground or a supply rail. When the input imbalance condition is removed, the discharging of the compensation capacitor may lead to excessive dual stage amplifier output response time and/or closed loop system overshoot, particularly where the compensation capacitor is large. Accordingly, there exists a need for improved apparatus and methods by which dual stage amplifier output response time and system overshoot may be reduced or eliminated.

SUMMARY OF THE INVENTION

The present invention provides a dual stage amplifier with a clamping circuit and a methodology which minimize or overcome the above mentioned shortcomings, along with a clamping circuit for use with a dual stage amplifier. The invention may be employed in order to reduce the overcharging of a compensation capacitor in such a dual stage amplifier, however, the invention finds utility and may be advantageously employed in other applications.

According to one aspect of the present invention, there is provided a dual stage amplifier, comprising a first amplifier stage with a first input and a first output, a second amplifier stage having a second output and a second input operatively connected to the first stage output. The amplifier further includes a compensation capacitor in electrical communication with the second stage input and the second stage output, and a clamping circuit in electrical communication with the second stage, wherein the clamping circuit is adapted to prevent overcharging of the compensation capacitor. The clamping circuit may include a low vgs clamp, a high vgs clamp, and/or a combination low vgs and high vgs clamp, wherein the low vgs clamp is adapted to counteract a drop in the second stage input voltage, and the high vgs clamp is adapted to counteract a rise in the second stage input voltage.

According to another aspect of the invention, the low vgs clamp may sense a voltage drop at the second stage input and inject current from a positive supply into the second stage input to counteract the sensed voltage drop, whereby overcharging of the compensation capacitor is reduced. In this regard, the second amplifier stage may include a MOS output transistor with a gate operatively connected to the first stage output and a drain operatively connected to the second stage output, wherein the output transistor is adapted to control the second stage output according to the second stage input, for example, in an inverter amplifier configuration. In this case, the low vgs clamp may comprise a first switching component, such as an NMOS transistor, operatively connected to the gate of the output transistor and adapted to sense a voltage at the second stage input and to provide a signal according to the sensed voltage.

In addition, the low vgs clamp may include a second switching component, such as a PMOS transistor, operatively connected to the positive supply and the first switching component which selectively provides current to the gate of the output transistor according to the signal from the first switching component. In this manner, the current provided by the second switching device to the gate of the output transistor counteracts a voltage drop at the second stage input. Thus, in an inverter type second stage, the sourcing of current to counteract a drop in the second stage input effectively reduces the amount or likelihood of overcharging of a compensation capacitor operatively connected in a feedback path between the second stage input and the second stage output. The clamping circuit may be further adapted to activate the provision of current when the voltage at the second stage input has reached a certain trip point or value, allowing for normal amplifier operation above such a value. For example, the trip point on the low vgs clamp may be advantageously set above the threshold voltage of the second stage MOS transistor, in order to ensure operation of the clamp circuit prior to the second stage transistor shutting off.

Where the clamping circuit includes a high vgs clamp, alone or in combination with a low vgs clamp, the high vgs clamp may also prevent or minimize overcharging of the compensation capacitor. Toward this end, the clamp may be adapted to sense a voltage rise at the second stage input and to sink current to the negative supply from the second stage input to counteract the sensed voltage rise, whereby the possibility of overcharging the compensation capacitor is reduced.

For example, where the second amplifier stage comprises a MOS output transistor with a gate operatively connected to the first stage output and a drain operatively connected to the second stage output in an inverter configuration, the high vgs clamp may comprise a first switching component operatively connected to the gate of the output transistor and adapted to sense a voltage at the second stage input and to provide a signal according to the sensed voltage. A second switching component operatively connected to the negative supply and the first switching component then selectively sinks current from the gate of the output transistor according to the signal from the first switching component, whereby the current sinked from the gate of the output transistor counteracts a voltage rise at the second stage input.

In such a high vgs clamp, the first switching component may comprise, for example, an NMOS transistor with a gate connected to the second stage input, and the second switching component may include an NMOS transistor connected to the second stage input, so as to sink current from the second stage input to counteract a voltage rise thereat, in accordance with a signal from the first switching component. The high vgs clamp may thus prevent or reduce overcharging of the compensation capacitor, thereby reducing the dual stage amplifier response time and system overshoot. In accordance with another aspect of the invention, the clamping circuit may include a high vgs clamp and/or a low vgs clamp, or a combination thereof, as needed or desired to account for anticipated or known input imbalance conditions, depending on the dual stage amplifier application and/or configuration.

According to still another aspect of the invention, there is provided a clamp circuit for clamping a second stage input in a dual stage amplifier having a first amplifier stage with a first input and a first output and a second amplifier stage with a second output and a second input operatively connected to the first output. The clamp circuit comprises means for sensing a voltage at the second stage input and providing a signal according to the sensed voltage, and means for selectively sourcing or sinking current to or from the second stage input, respectively, according to the signal. The means for sensing the voltage at the second stage input and providing a signal according to the sensed voltage may include a first switching component operatively connected to the second stage input and adapted to sense a voltage at the second stage input and to provide a signal according to the sensed voltage. In addition, the means for selectively sourcing or sinking current to the second stage input according to the signal may comprise a second switching component operatively connected the first switching component and one of a positive and a negative supply, which is adapted to selectively source or sink current to or from the second stage input, respectively, according to the signal from the first switching component.

Where, for example, the second amplifier stage comprises a MOS output transistor with a gate operatively connected to the first stage output and a drain operatively connected to the second stage output for controlling the second stage output according to the second stage input, the first switching component may be operatively connected to the gate of the output transistor and may accordingly sense a voltage at the second stage input and provide a signal according to the sensed voltage. In this regard, the second switching component may be operatively connected to a positive supply and the first switching component and may selectively provide current to the gate of the output transistor according to the signal from the first switching component.

In this manner, the current provided to the gate of the output transistor counteracts a voltage drop at the second stage input, thus preventing or minimizing the deleterious effects due to overcharging of a compensation capacitor connected from the second stage input to the second stage output. As another example, the second switching component may be operatively connected to a negative supply and the first switching component and adapted to selectively sink current from the gate of the output transistor according to the signal from the first switching component, whereby the current sinked from the gate of the output transistor counteracts a voltage rise sensed by the first switching component at the second stage input.

In accordance with yet another aspect of the invention, there is provided a method of biasing the second stage input in a dual stage amplifier. The method comprises providing a first component in electrical communication with the second stage input, sensing a voltage at the second stage input using the first component, generating a signal using the first component according to the sensed voltage at the second stage input, providing a second component in electrical communication with the first component and the second stage input, and selectively biasing the second stage input away from one of a positive supply and a negative supply according to the signal from the first component.

The step of selectively biasing the second stage input may include selectively sourcing or sinking current to or from the second stage input, respectively, using the second component according to the signal from the first component. This may include, for example, selectively sourcing current to the second stage input using the second component according to the signal from the first component, whereby the second stage input is selectively biased away from the negative supply, and/or selectively sinking current from the second stage input using the second component according to the signal from the first component, whereby the second stage input is selectively biased away from the positive supply.

According to another aspect of the invention, where the method is employed in connection with a dual stage amplifier, wherein the second amplifier stage comprises a MOS output transistor with a gate operatively connected to the first stage output and a drain operatively connected to the second stage output, the first component may be operatively connected to the gate of the output transistor and adapted to sense a voltage at the second stage input and to provide a signal according to the sensed voltage. In addition, the second component may be operatively connected to the positive or negative supply and the first switching component and adapted to selectively source or sink current to or from the gate of the output transistor, respectively, according to the signal from the first switching component. Thus, the methodology provides a current which is sourced to or sinked from the gate of the output transistor, which advantageously counteracts a voltage change at the second stage input, thereby minimizing or eliminating compensation capacitor overcharging.

According to yet another aspect of the invention, there is provided a method of preventing overcharging of a compensation capacitor in an amplifier circuit. The method includes sensing a node voltage associated with the compensation capacitor, determining whether the sensed node voltage is within a desired range, and providing compensation to the amplifier according to the sensed voltage if the sensed voltage is outside the desired range. For example, determining whether the sensed node voltage is within a desired range may comprise determining whether the sensed node voltage is greater than a desired maximum voltage. In addition, providing compensation to the amplifier according to the sensed voltage if the sensed voltage is outside the desired range may comprise sinking current from the node associated with the compensation capacitor if the sensed node voltage is greater than the desired maximum voltage.

Alternatively, or in combination, the step of determining whether the sensed node voltage is within a desired range may comprise determining whether the sensed node voltage is less than a desired minimum voltage, and the step of providing compensation to the amplifier according to the sensed voltage if the sensed voltage is outside the desired range may comprise sourcing current to the node associated with the compensation capacitor if the sensed node voltage is less than the desired minimum voltage.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7 is a flow diagram illustrating an exemplary method in accordance with another aspect of the invention; and FIG. 8 is a flow diagram illustrating another exemplary method in accordance with the invention.

DETAILED DESCRIPTION OF THE INVENTION

The present invention will now be described with respect to the accompanying drawings in which like numbered elements represent like parts. The invention is directed to an apparatus and methodology for preventing the overcharging of a dual stage amplifier compensation capacitor. The invention thereby reduces the response time associated with the output of the dual stage amplifier and overshoot associated with systems in which the amplifier may be employed. While the invention is illustrated hereinafter in association with one or more specific applications, it will be recognized by those skilled in the art that the invention finds utility in applications other than those specifically illustrated and described herein.

Figure 1:
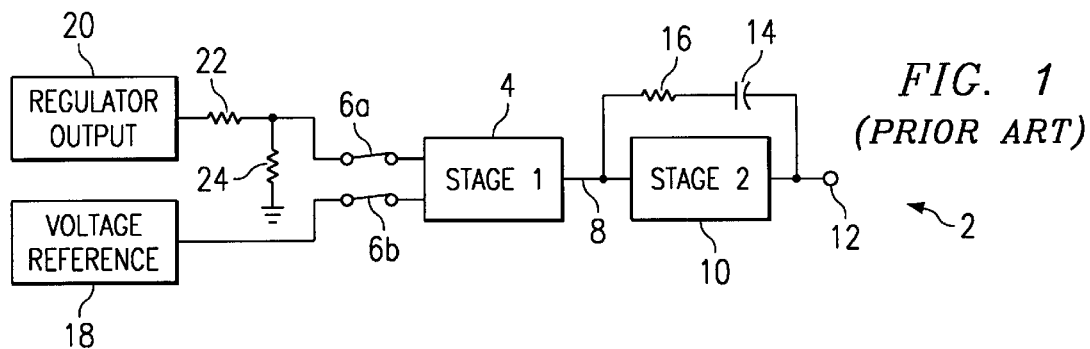
FIG. 1 is a schematic illustration of a conventional dual stage amplifier with a compensation capacitor.

Referring now to the drawings, FIG. 1 illustrates a conventional dual stage amplifier 2 with a first stage 4 having a pair of input terminals 6a and 6b and an output 8. The first stage output 8 is also the input to a second stage 10 having an output terminal 12. The stages 4 and 10 may each include one or more electronic components, for example, transistors, and the like, whereby the output 12 of the second stage is related to the inputs 6a and 6b of the first stage. The first stage 4 may comprise, for example, a differential pair, where the first stage output 8 is proportional to the voltage difference between the input terminals 6a and 6b. In addition, the second stage 10 may include an inverter amplifier, such as an NMOS transistor and associated biasing circuitry, whereby the second stage output 12 is inversely proportional to the second stage input 8.

The dual stage amplifier 2 further includes a compensation capacitor 14 and a resistor 16 serially connected between the second stage input 8 and the second stage output 12. The capacitor 14 may advantageously provide feedback from the output 12 to the input 8 of the second stage 10, and may be adapted to compensate for instability in the amplifier 2. In addition, the size of capacitor 14 may be varied according to the desired frequency response characteristics of the circuit. Thus, where the bandwidth of the dual stage amplifier 2 needs to be reduced, the compensation capacitor 14 may be relatively large. For example, where the amplifier 2 is used as an error amplifier in a switching regulator (not shown), it may be desirable to reduce the bandwidth below the switching frequency of the switching regulator.

Overcharging of the compensation capacitor 14 may lead to unacceptably long response times at the second stage output 12. Such overcharging may occur when the differential input terminals 6a and 6b are imbalanced, such as during power up when the terminals are in indeterminate states. For example, in a switching regulator application, the dual stage error amplifier 2 may have a positive differential input terminal 6b connected to a reference voltage source 18, and a negative differential input terminal 6a connected to the output of regulator 20 through a resistive voltage divider network comprising resistors 22 and 24. Due to the internal timing of the switching regulator, the reference 18 may rise to its steady state voltage faster than the regulated output 20. Thus, an imbalance occurs at the differential inputs 6a and 6b, where the positive terminal 6b is at the voltage of the reference 18 and the negative terminal 6a is near zero volts. Such an input imbalance condition may cause overcharging of the capacitor 14, particularly where the second amplifier stage 10 is an inverter. When the input imbalance condition is removed, the discharging of the compensation capacitor 14 may lead to an unacceptable or excessive response time in the output 12 of the amplifier 2, particularly where the compensation capacitor 14 is large.

Figure 2:
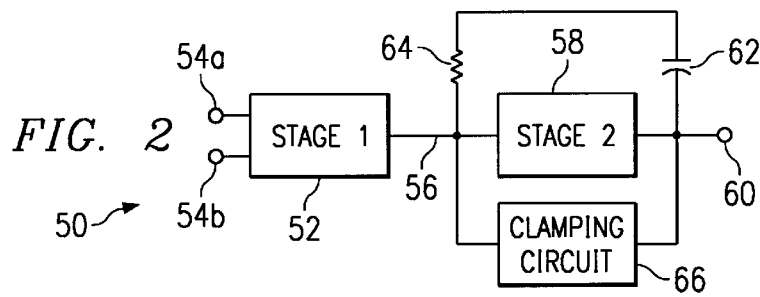
FIG. 2 is a schematic illustration of an exemplary dual stage amplifier with a clamping circuit in accordance with an aspect of the present invention.

Referring now to FIG. 2, an exemplary dual stage amplifier 50 is illustrated in accordance with an aspect of the present invention. Amplifier 50 includes a first stage 52 with a pair of input terminals 54a and 54b, as well as an output 56, which is operatively connected as the input to a second amplifier stage 58 having an output 60. A compensation capacitor 62 and a feedback resistor 64 are serially connected between the input 56 and output 60 of the second amplifier stage 58 for compensation of instability in the amplifier 50 as well as for controlling the output bandwidth thereof. The exemplary dual stage amplifier 50 further comprises a clamping circuit 66 in electrical communication with the second stage 58 which is adapted to prevent overcharging of the compensation capacitor 62.

In the exemplary amplifier 50 of FIG. 2, the clamping circuit 66 is operatively connected to both the input 56 and the output 60 of the second stage 58. For example, the clamping circuit 66 may be adapted to bias the input 56 of the second stage 58 away from one of a negative and a positive supply (not shown) based on a sensed voltage at the second stage input 56. The clamping circuit 66 may thus be adapted to limit the voltage difference between the input 56 and the output 60 of the second stage 58 of the amplifier 50, and thereby to minimize or eliminate overcharging of the compensation capacitor 62.

In accordance with an aspect of the invention, the clamping circuit 66 may be adapted to sense a node voltage associated with the compensation capacitor 58 (e.g., by sensing the voltage at the second stage input node 56), to determine whether the sensed node voltage is within a desired range (e.g., above or below a predetermined voltage maximum level and a voltage minimum level, respectively), and to provide compensation to the amplifier (e.g., by selectively sourcing and/or sinking current to or from the second stage input node 56) if the sensed voltage is outside the desired range. In this manner, the clamping circuit may advantageously reduce the charging of the compensation capacitor 62.

Figure 3:
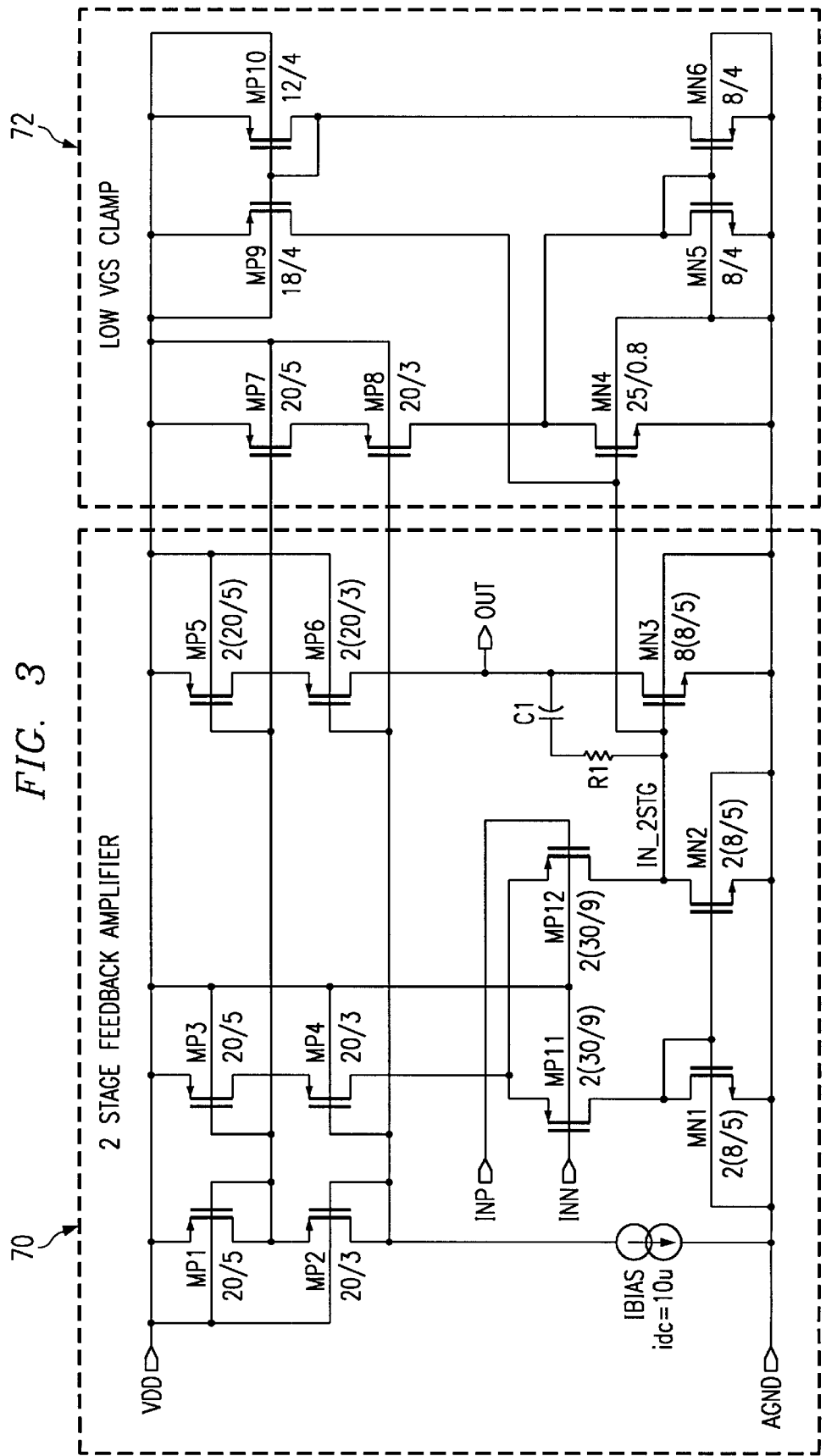
FIG. 3 is a schematic illustration of another exemplary dual stage amplifier having a low vgs clamping circuit according to another aspect of the invention.

Referring now to FIG. 3, another exemplary dual stage amplifier 70 is illustrated having a low vgs clamping circuit 72 according to another aspect of the invention. The amplifier 70 includes positive and negative differential input terminals INP and INN, respectively, connected to a differential pair comprising PMOS transistors MP12 and MP11. The differential pair MP11/MP12 is biased via a current mirror circuit comprising PMOS transistors MP3 and MP4 providing a current to the differential pair roughly equal to a bias current IBIAS (e.g., 10 μA dc) established by PMOS transistors MP1 and MP2. An active load is provided to the differential pair MP11/MP12 comprising NMOS transistors MN1 and MN2. It will be recognized that in steady state operation with the differential inputs INP and INN balanced, that substantially equal currents (e.g., IBIAS/2) will flow through load transistors MN1 and MN2.

The amplifier 70 further comprises a second amplifier stage including an NMOS transistor MN3 biased with a current of approximately 2*IBIAS via a PMOS transistor current mirror circuit comprising transistors MP5 and MP6. Power for the amplifier 70 is provided by a positive supply VDD with respect to an analog ground AGND. Although the exemplary amplifier 70 and clamping circuit 72 are illustrated in single-ended form, the invention also may be employed in conjunction with dual supply architectures, for instance, where the amplifier and/or clamping circuit is supplied from two supplies of opposite electrical polarity. The second stage transistor MN3 is configured as an inverter with a source connected to AGND, a drain connected to the drain of MP6 and providing the second stage output OUT, and also with a gate connected between the drains of MP12 and MN2, thus providing the input IN_2STG to the second amplifier stage. A compensation capacitor C1 is serially connected with resistor R1 in a feedback path between the drain and gate of second stage transistor MN3 for compensation of instability and/or bandwidth control.

In accordance with an aspect of the invention, a clamping circuit 72 is provided in the dual stage amplifier 70 in order to prevent or minimize overcharging of the compensation capacitor C1, for example, where an imbalance in the input terminals INP and INN exists. The clamping circuit 72 includes a low vgs clamping arrangement for sensing the voltage at the second stage input IN_2STG (e.g., the gate voltage of the second stage transistor MN3 with respect to AGND) and for injecting current from the positive supply VDD into the second stage input IN_2STG to counteract a sensed voltage drop thereat, as illustrated and described in greater detail hereinafter.

It will be appreciated that in the exemplary amplifier 70, an input imbalance condition may occur wherein the voltage at the positive differential input INP is much greater than the voltage at the negative input INN, in which case the second stage input IN_2STG goes low, which turns transistor MN3 off. The resulting voltage differential between the output OUT and the second stage input IN_2STG tends to overcharge the capacitor C1, absent intervention from the clamping circuit 72. Accordingly, the clamping circuit 72 advantageously senses the voltage drop (associated with the input imbalance) in the second stage input IN_2STG (e.g., Vgs of transistor MN3) and counteracts it by injecting current into the second stage input IN_2STG to thereby balance the current through the load transistor MN2 with that of transistor MN1. In this regard, it will be noted that when such an input imbalance condition exists (absent intervention via the clamping circuit 72), the majority or all of the current (e.g., IBIAS) provided by current mirror MP3/MP4 conducts through differential pair transistor MP11 and hence through load transistor MN1, with little or no current conducting through MP12 and MN2.

The exemplary clamping circuit 72 includes a first switching component, such as NMOS transistor MN4, operatively connected to the gate of the second stage output transistor MN3. The drain of MN4 is connected to the drain of a PMOS transistor MP8, which together with PMOS transistor MP7 forms a current mirror circuit to provide a current roughly equal to IBIAS. In normal operation, the transistor MN4 conducts all or most of this current. The transistor MN4 senses the voltage at the second stage input IN_2STG, and provides a signal at the drain of MN4 according to the sensed voltage.

For example, where the second stage input voltage IN_2STG drops from a nominal operating level, the clamping circuit transistor MN4 tends to turn off, thus causing the current from current mirror MP7/MP8 to divert away from the drain of MN4 (e.g., which is now a higher impedance) through NMOS transistor MN5, thereby turning on NMOS transistor MN6. Transistor MN6, in turn, reduces the gate voltages of a PMOS transistor pair MP9/MP10, resulting in the conduction of current from the positive supply VDD into the second stage input IN_2STG through transistor MP9. This injected current counteracts the sensed voltage drop at IN_2STG by providing a balancing current to load transistor MN2 (e.g., to balance the IBIAS current flowing through MP11 and MN1), resulting in elimination or reduction in the overcharging of the compensation capacitor C1, and the deleterious output response time problems associated therewith.

Figure 4:
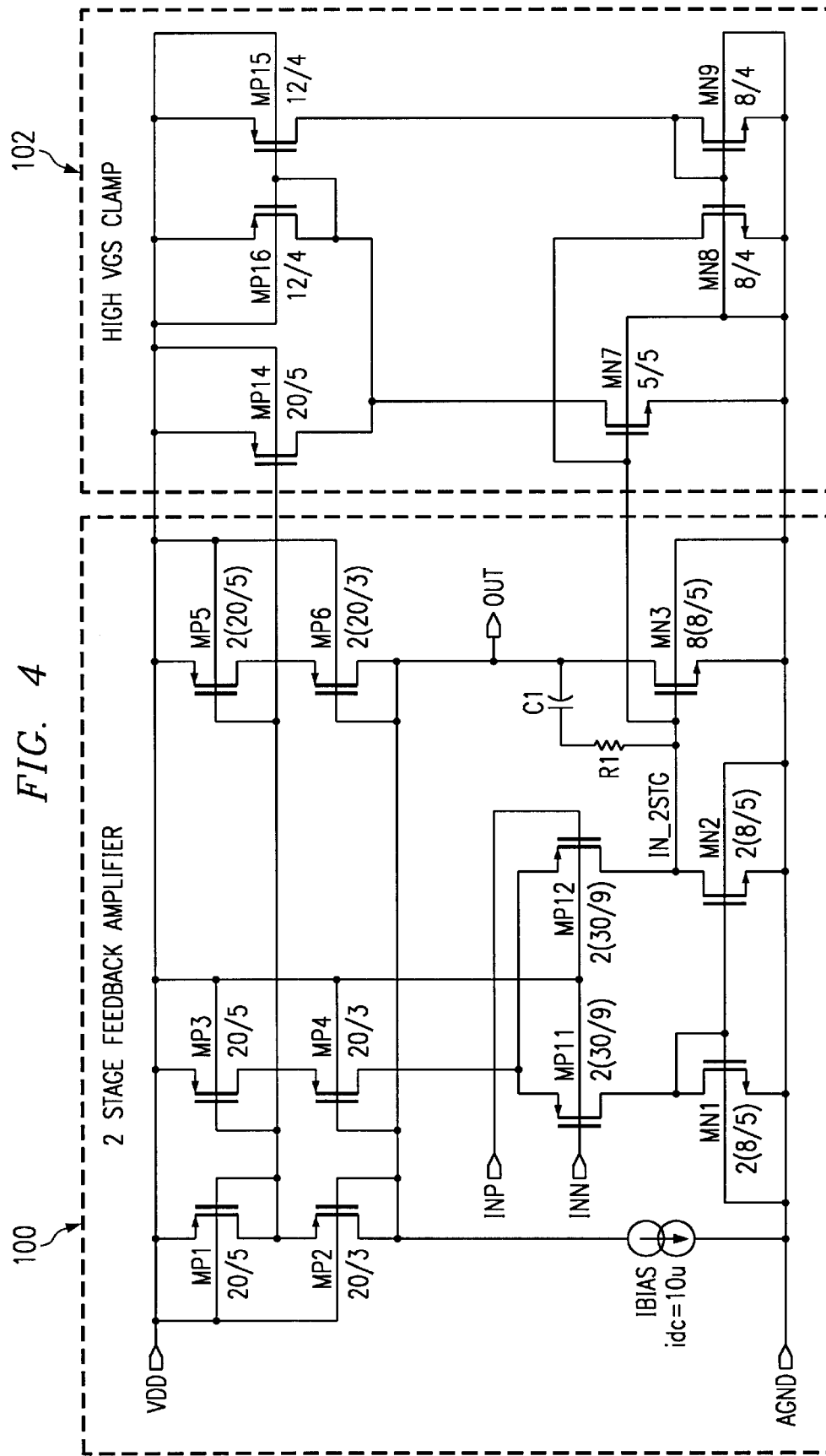
FIG. 4 is a schematic illustration of another exemplary dual stage amplifier having a high vgs clamping circuit according to another aspect of the invention.

Referring now to FIG. 4, another exemplary dual stage amplifier 100 is illustrated having a clamping circuit 102 adapted to selectively bias the second stage input IN_2STG away from the positive supply VDD according to a sensed voltage rise at the second stage input IN_2STG. The first and second stages of the amplifier 100 are similar to those of the exemplary amplifier 70 of FIG. 3, and will not be described separately for the sake of brevity. The high vgs clamping circuit 102 includes a first switching component, such as NMOS transistor MN7 having a gate connected to the second stage input IN_2STG in order to sense the voltage thereat. Transistor MN7 is biased via current from PMOS transistor MP14.

In response to a rise in the voltage IN_2STG above a nominal operating level, the transistor MN7 tends to turn on, which causes PMOS transistors MP15 and MP16 to conduct. This raises the gate voltages of NMOS current mirror transistors MN8 and MN9, causing these to also turn on. The transistor MN8 thus begins to conduct current, thereby sinking current from the second stage input node IN_2STG, which counteracts the sensed voltage rise thereat. Thus, the high vgs clamping circuit 102 biases the second stage input IN_2STG away from the positive supply VDD to thereby reduce or eliminate overcharging of the compensation capacitor C1.

Figure 5:
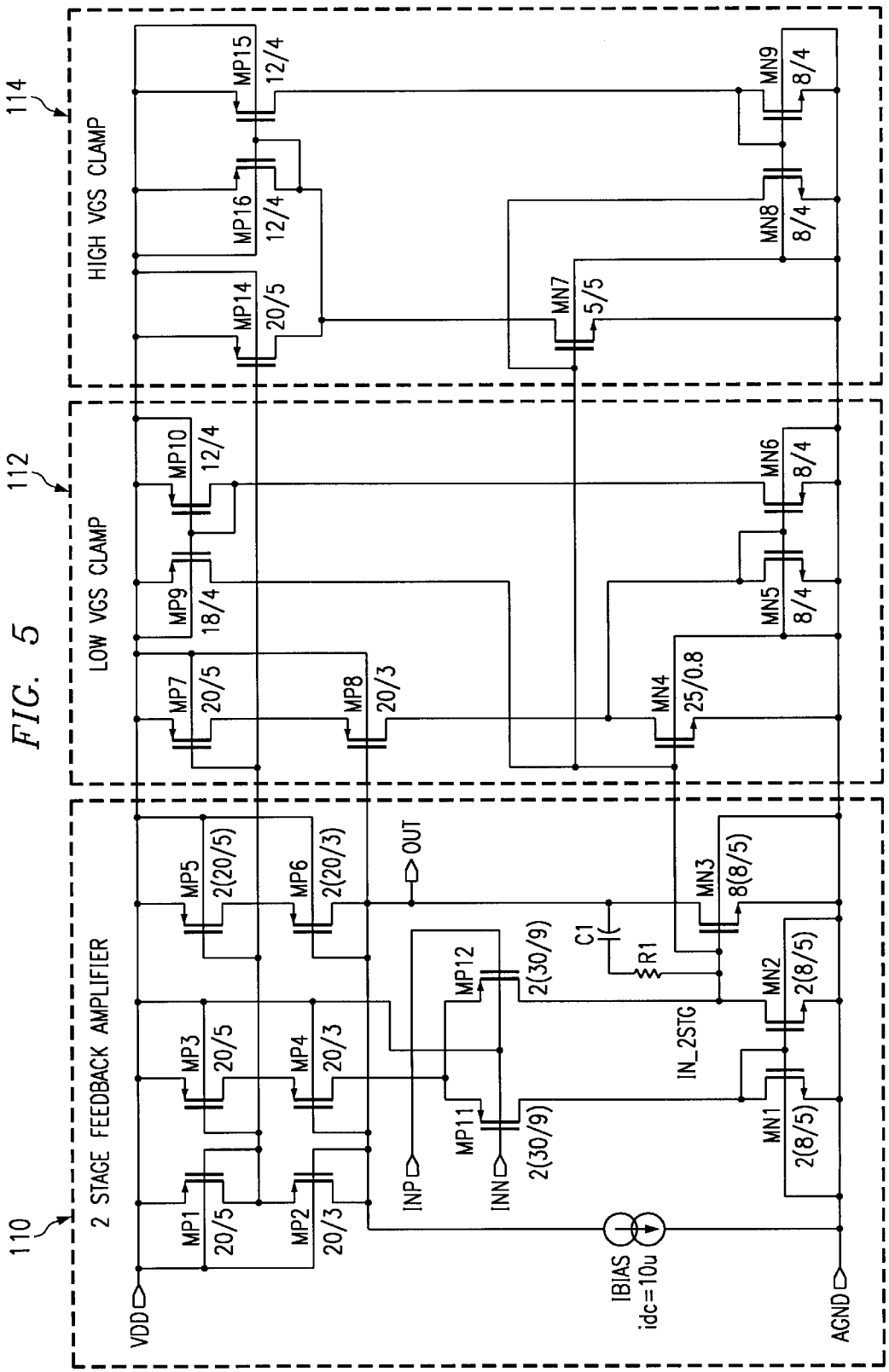
FIG. 5 is a schematic illustration of another exemplary dual stage amplifier having high vgs and low vgs clamping circuits according to another aspect of the invention.

Referring also to FIG. 5, the invention further comprises a dual stage amplifier 110 having both a low vgs clamping circuit 112, as well as a high vgs clamping circuit 114. In operation, the clamp circuits 112 and 114 may be inactive when no input imbalance exists, and may individually operate to counteract transitions in the second stage input voltage IN_2STG away from a nominal operating voltage. For example, the low vgs clamp circuit 112 may be operable to selectively source current from the positive supply VDD to the second stage input IN_2STG via MP9 conducting such current according to a voltage drop thereat based on a signal from transistor MN4, as described above with respect to clamping circuit 72 of FIG. 3.

In this regard, the low vgs clamping circuit 112 may be adapted to begin sourcing current through transistor MP9 when the second stage input voltage IN_2STG transitions below a certain value. In the exemplary circuit 112, for example, current sourcing via MP9 begins when the voltage at IN_2STG falls below about two thirds of the voltage range between the nominal operating voltage (e.g., where the voltages at the differential input terminals INP and INN are approximately equal) and the threshold voltage of the second stage transistor MN3. This trip point value may be adjusted according to the desired operation of the clamping circuit 112, for example, by adjusting the relative sizes of current mirror transistors MP9 and MP10.

It will be further noted in this regard, that the relative sizing of MP9 and MP10 provides for conduction of current approximately equal to IBIAS through MP9 (e.g., and hence into the second stage input node IN_2STG to balance the current in MN2 with that of MN1 in an input imbalance condition) when the current through transistor MP10 (e.g., and hence that through current mirror transistors MN5 and MN6) is approximately two-thirds of IBIAS. Thus, when transistor MN4 turns off (e.g., according to a voltage drop at IN_2STG) to the point where approximately two-thirds of the current from MP8 is diverted through MN5 (rather than through MN4), a current of IBIAS is sourced to the second stage input IN_2STG via MP9. It will be noted that other trip point values are possible through adjustment to the relative sizing of the various components of the clamping circuit 112, which fall within the scope of the present invention.

In similar fashion, the high vgs clamp circuit 114 may be adapted to begin a current sinking operation via transistor MN8 at a certain value of the voltage at IN_2STG, as sensed by transistor MN7. It will be appreciated that the operation of the high vgs clamp circuit 114 is similar to that of the clamp 102 of FIG. 4, whereby further description thereof is omitted for the sake of brevity. With regard to the operational levels of the high vgs clamp circuit 114, it will be appreciated that the relative sizing of the component transistors therein may be adjusted to provide for current sinking operation with respect to the second stage input IN_2STG via transistor MN8 upon transition of the second stage input voltage at IN_2STG above a certain trip point value, whereas when the nominal operating voltage is present at the second stage input IN_2STG, the high vgs clamping circuit 114 may be inactive.

By the provision of one or more clamping circuits of a positive and/or negative biasing nature, the present invention achieves reduced overcharging of the compensation capacitor C1, whereby this capacitor may advantageously provide for predictable instability compensation and/or bandwidth reduction in accordance with the designed size of capacitor C1, with the clamping circuitry adapted to prevent excess charging of the capacitor due to imbalanced input or other adverse conditions. In this fashion, the output response time may be improved in a controlled fashion according to the specific clamping circuitry design. It will be further appreciated that many clamping circuit designs are possible within the scope of the present invention, apart from those specifically illustrated and/or described herein.

Figure 6A:
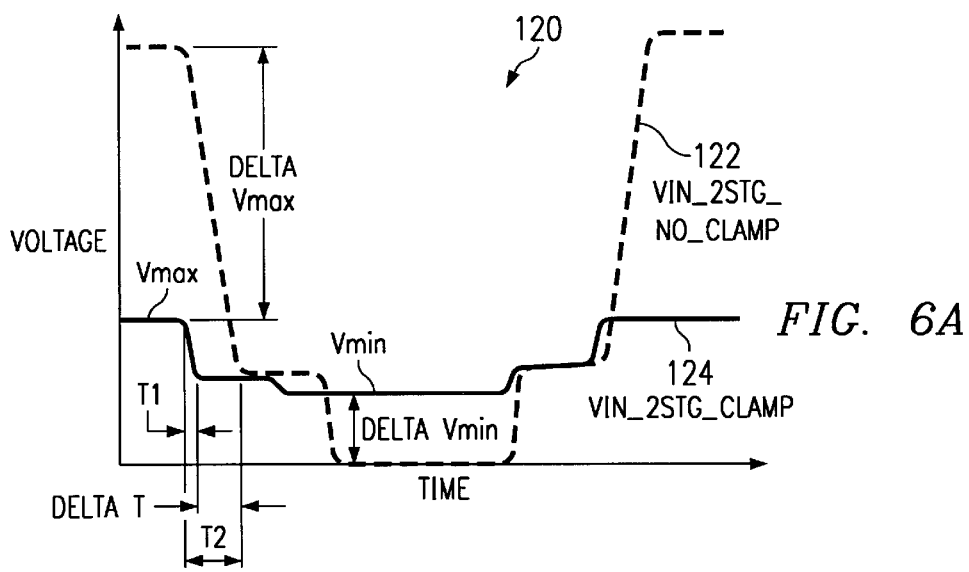
FIG. 6A is a graph illustrating a performance characteristic of the exemplary dual stage amplifier with the high vgs and low vgs clamping circuits of FIG. 5.

Referring also to FIG. 6A, a graph 120 illustrates an exemplary performance characteristic of the exemplary dual stage amplifier 110 with the clamping circuits 112 and 114 of FIG. 5. The graph 120 includes curves 122 and 124 representing the second stage input voltage IN_2STG with no clamping circuit and with the clamping circuits 112 and 114, respectively. As can be seen from the graph 120, the response time T1 for the amplifier 110 with clamping circuits 112 and 114 is much less than the response time T2 where no clamping is provided. Thus, the inclusion of the clamping circuits 112 and 114 in the dual stage amplifier 110 significantly reduces the response time when compared with an amplifier circuit having no clamping circuit, resulting in a response time decrease of Delta T. Moreover, the clamping circuits 112 and 114 clamp the second stage input IN_2STG between Vmin and Vmax, respectively, as illustrated in FIG. 6A. The clamping thus provided in the exemplary amplifier 110 via clamping circuits 112 and 114 reduces the voltage at the second stage input IN_2STG by the amounts Delta Vmin and Delta Vmax, respectively.

Figure 6B:
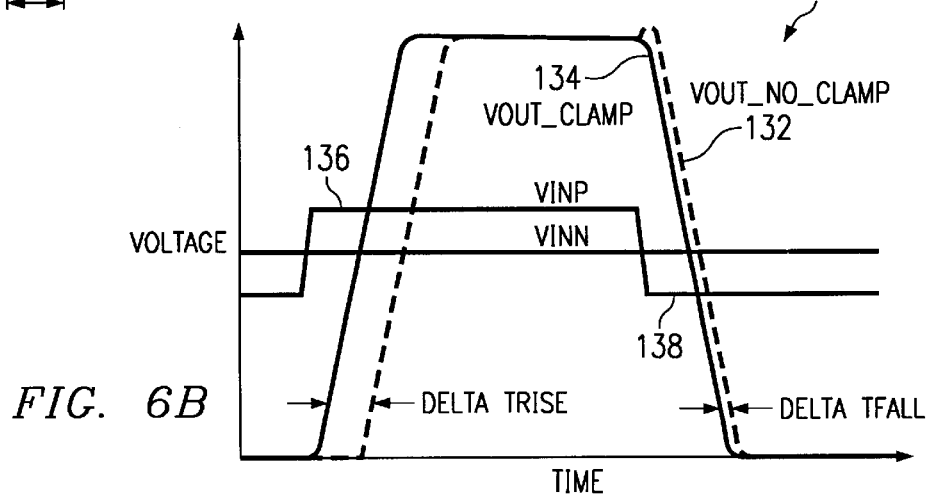
FIG. 6B is a graph illustrating another performance characteristic of the exemplary dual stage amplifier with the high vgs and low vgs clamping circuits of FIG. 5.

Similarly in FIG. 6B, the second stage output response is illustrated for the case where the amplifier 110 of FIG. 5 includes no clamping circuitry, and the case where clamping circuits 112 and 114 are included. The graph 130 illustrates the second stage output voltage OUT as a function of time for the case 132 where no clamping circuit is provided, and the case 134 where the clamping circuits 112 and 114 are provided. Where the respective polarities of the differential inputs VINP 136 and VINN 138 are reversed, the graph 130 illustrates the reduced output response time resulting from the inclusion of the clamping circuits 112 and 114 in the amplifier 110. Thus, the clamping circuits 112 and 114 provide response time reductions Delta Trise and Delta Tfall as illustrated in FIG. 6B.

Referring now to FIG. 7, a method 150 is illustrated for preventing overcharging of a compensation capacitor (e.g., compensation capacitor C1 of FIG. 5) in accordance with another aspect of the invention. Beginning at step 152, a node voltage associated with a compensation capacitor is sensed. For example, the voltage at node IN_2STG in FIG. 5 may be sensed via the NMOS transistor M4N of the low vgs clamp circuit 112 and/or the NMOS transistor MN7 of the high vgs clamping circuit 114. At decision step 154, a determination is made as to whether the sensed voltage is within a desired operating range. If so, the method 150 returns to step 152 where the node voltage is again sensed. If the sensed voltage is outside the desired range at step 154, the method 150 proceeds to step 156 whereat compensation is provided according to the sensed voltage (e.g., via one of the low vgs and high vgs clamping circuits 112 and 114, respectively, as described above).

A determination is made at step 158 as to whether the sensed voltage is greater than a desired maximum voltage. If so, compensation current is sinked (e.g., via the NMOS transistor MN8 of the high vgs clamp circuit 114) from a node associated with the compensation capacitor (e.g., the second stage input node IN_2STG) at step 160, where after the method 150 returns to again sense the node voltage at step 152. However, if the sensed voltage is less than a desired minimum voltage at step 162, a compensation current is sourced (e.g., via PMOS transistor MP9 of the low vgs clamp circuit 112) to a node associated with the compensation capacitor (e.g., node IN_2STG) at step 164, before the method 150 returns again to step 152. The method thus reduces or eliminates the overcharging of the compensation capacitor, resulting in improved amplifier output response time and system overshoot performance.

Referring now to FIG. 8, another exemplary method 200 for biasing the second stage input of a dual stage amplifier is illustrated in accordance with another aspect of the present invention. Beginning at step 202, a first switching component is provided (e.g., transistor MN4 of FIG. 3), which is connected to the second stage input of the amplifier. At step 204, a voltage at the second stage input (e.g., Vgs of transistor MN3 at IN_2STG of FIG. 3) is sensed using the first switching component. A signal is generated at step 206 using the first switching component according to the sensed voltage. At step 208, a second switching component (e.g., transistor MP9 of FIG. 3) is provided, which is connected to the first switching component (e.g., using transistors MN5, MN6, and MP10), and to the input of the amplifier second stage (e.g., the drain of MP9 is connected to second stage input IN_2STG of FIG. 3).

Accordingly, at step 210, the input of the second amplifier is biased away from a positive or negative supply using the second switching component in accordance with the signal from the first switching component. The method 200 thus reduces the deleterious effects of compensation capacitor overcharging described above, while allowing the capacitor to be sized according to other device performance considerations, such as stability and bandwidth. In this regard, it will be noted that the methods of the invention (e.g., methods 150 and 200 of FIGS. 7 and 8, respectively) may be implemented in the devices and systems illustrated and described herein. However, these methods may also be advantageously employed in other systems and apparatus apart therefrom.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising."

What is claimed is:

1. A dual stage amplifier, comprising:
    a first amplifier stage having a first stage input and a first stage output;
    a second amplifier stage having a second stage input operatively connected to the first stage output, and a second stage output;
    a compensation capacitor in electrical communication with the second stage input and the second stage output; and
    a clamping circuit in electrical communication with the second stage, and adapted to prevent an overcharging of the compensation capacitor when an imbalance condition exists at the first stage input of the first amplifier stage.

2. The amplifier of claim 1, wherein the clamping circuit includes a low vgs clamp adapted to bias the second stage input away from a negative supply when a voltage at the second stage input falls below a first predetermined level.

3. The amplifier of claim 2, wherein the low vgs clamp is further adapted to sense a voltage drop below the first predetermined level at the second stage input and to inject current from a positive supply into the second stage input to counteract the sensed voltage drop, whereby the second stage input is biased away from the negative supply in response thereto.

4. The amplifier of claim 3, wherein the second amplifier stage comprises a MOS output transistor with a gate operatively connected to the first stage output and a drain operatively connected to the second stage output, wherein the MOS output transistor is adapted to control the second stage output according to the second stage input, and wherein the low vgs clamp comprises a first switching component operatively connected to the gate of the MOS output transistor and adapted to sense a voltage at the second stage input and to provide a signal according to the sensed voltage, and a second switching component operatively connected to the positive supply and the first switching component, and adapted to selectively provide current to the gate of the MOS output transistor according to the signal from the first switching component, whereby the current provided to the gate of the MOS output transistor counteracts a voltage drop at the second stage input.

5. The amplifier of claim 2, wherein the clamping circuit includes a high vgs clamp adapted to bias the second stage input away from a positive supply when a voltage at the second stage input rises above a second predetermined level.

6. The amplifier of claim 5, wherein the high vgs clamp is further adapted to sense a voltage rise above the second predetermined level at the second stage input and to sink current to the negative supply from the second stage input to counteract the sensed voltage rise, whereby the second stage input is biased away from the positive supply in response thereto.

7. The amplifier of claim 6, wherein the second amplifier stage comprises a MOS output transistor with a gate operatively connected to the first stage output and a drain operatively connected to the second stage output, wherein the MOS output transistor is adapted to control the second stage output according to the second stage input, and wherein the high vgs clamp comprises a first switching component operatively connected to the gate of the MOS output transistor and adapted to sense a voltage at the second stage input and to provide a signal according to the sensed voltage, and a second switching component operatively connected to the negative supply and the first switching component and adapted to selectively sink current from the gate of the MOS output transistor according to the signal from the first switching component, whereby the current sinked from the gate of the MOS output transistor counteracts a voltage rise at the second stage input.

8. The amplifier of claim 7, wherein the high vgs clamp is further adapted to sense a voltage rise at the second stage input and to sink current to a negative supply from the second stage input to counteract the sensed voltage rise, whereby the second stage input is biased away from the positive supply in response thereto.

9. The amplifier of claim 8, wherein the second amplifier stage comprises a MOS output transistor with a gate operatively connected to the first stage output and a drain operatively connected to the second stage output, wherein the MOS output transistor is adapted to control the second stage output according to the second stage input, and wherein the high vgs clamp comprises a first switching component operatively connected to the gate of the MOS output transistor and adapted to sense a voltage at the second stage input and to provide a signal according to the sensed voltage, and a second switching component operatively connected to the negative supply and the first switching component and adapted to selectively sink current from the gate of the MOS output transistor according to the signal from the first switching component, whereby the current sinked from the gate of the MOS output transistor counteracts a voltage rise at the second stage input.

10. The amplifier of claim 1, wherein the clamping circuit includes a high vgs clamp adapted to bias the second stage input away from a positive supply when a voltage at the second stage input rises above a predetermined level.

11. A clamp circuit for clamping an input in a dual stage amplifier having a first amplifier stage with a first stage input and a first stage output and a second amplifier stage with a second stage input operatively connected to the first stage output, and a second stage output, the clamp circuit comprising:
   a circuit for sensing a voltage at the second stage input and providing a signal according to the sensed voltage; and
   a circuit for selectively sourcing or sinking current to the second stage input according to the signal,
   wherein the circuit for sensing a voltage at the second stage input and providing a signal according to the sensed voltage comprises a first switching component operatively connected to the second stage input and adapted to sense a voltage at the second stage input and to provide a signal according to the sensed voltage, and wherein the circuit for selectively sourcing or sinking current to the second stage input according to the signal comprises a second switching component operatively connected the first-switching component and one of a positive and a negative supply, and adapted to selectively source or sink current to or from the second stage input, respectively, according to the signal from the first switching component.

12. The clamp circuit of claim 11, wherein the second amplifier stage comprises a MOS output transistor with a gate operatively connected to the first stage output and a drain operatively connected to the second stage output, wherein the MOS output transistor is adapted to control the second stage output according to the second stage input, and wherein the first switching component is operatively connected to the gate of the MOS output transistor and adapted to sense a voltage at the second stage input and to provide a signal according to the sensed voltage, and wherein the second switching component is operatively connected to a positive supply and the first switching component and adapted to selectively provide current to the gate of the MOS output transistor according to the signal from the first switching component, whereby the current provided to the gate of the MOS output transistor counteracts a voltage drop at the second stage input.

13. The clamp circuit of claim 11, wherein the second amplifier stage comprises a MOS output transistor with a gate operatively connected to the first stage output and a drain operatively connected to the second stage output, wherein the MOS output transistor is adapted to control the second stage output according to the second stage input, and wherein the first switching component is operatively connected to the gate of the MOS output transistor and adapted to sense a voltage at the second stage input and to provide a signal according to the sensed voltage, and wherein the second switching component is operatively connected to a negative supply and the first switching component and adapted to selectively sink current from the gate of the MOS output transistor according to the signal from the first switching component, whereby the current sinked from the gate of the MOS output transistor counteracts a voltage rise at the second stage input.

14. In a dual stage amplifier having a first amplifier stage with a first stage input and a first stage output and a second amplifier stage with a second stage input operatively connected to the first stage output, and a second stage output, a method of biasing the second stage input, comprising:
   providing a first component in electrical communication with the second stage input;
   sensing a voltage at the second stage input using the first component;
   generating a signal using the first component according to the sensed voltage at the second stage input;
   providing a second component in electrical communication with the first component and the second stage input; and
   selectively biasing the second stage input away from one of a positive supply and a negative supply according to the signal from the first component.

15. The method of claim 14, wherein selectively biasing the second stage input away from one of a positive supply and a negative supply according to the signal from the first component comprises selectively sourcing or sinking current to or from the second stage input, respectively, using the second component according to the signal from the first component.

16. The method of claim 15, wherein selectively biasing the second stage input away from one of a positive supply and a negative supply according to the signal from the first component comprises selectively sourcing current to the second stage input using the second component according to the signal from the first component, whereby the second stage input is selectively biased away from the negative supply.

17. The method of claim 16, wherein selectively biasing the second stage input away from one of a positive supply and a negative supply according to the signal from the first component comprises selectively sinking current from the second stage input using the second component according to the signal from the first component, whereby the second stage input is selectively biased away from the positive supply.

18. The method of claim 15, wherein selectively biasing the second stage input away from one of a positive supply and a negative supply according to the signal from the first component comprises selectively sinking current from the second stage input using the second component according to the signal from the first component, whereby the second stage input is selectively biased away from the positive supply.

19. The method of claim 14, wherein the second amplifier stage comprises a MOS output transistor with a gate operatively connected to the first stage output and a drain operatively connected to the second stage output, wherein the MOS output transistor is adapted to control the second stage output according to the second stage input, and wherein the first component is operatively connected to the gate of the MOS output transistor and adapted to sense a voltage at the second stage input and to provide a signal according to the sensed voltage, and wherein the second component is operatively connected to the positive supply and the first switching component and adapted to selectively source or sink current to or from the gate of the MOS output transistor, respectively, according to the signal from the first switching component, whereby the current sourced to or sinked from the gate of the MOS output transistor counteracts a voltage change at the second stage input.

20. A method of preventing overcharging of a compensation capacitor in an amplifier circuit, comprising:

sensing a node voltage associated with the compensation capacitor;

determining whether the sensed node voltage is within a desired range; and providing compensation to the amplifier according to the sensed voltage if the sensed voltage is outside the desired range, wherein determining whether the sensed node voltage is within a desired range comprises determining whether the sensed node voltage is greater than a desired maximum voltage, and wherein providing compensation to the amplifier according to the sensed voltage if the sensed voltage is outside the desired range comprises sinking current from the node associated with the compensation capacitor if the sensed node voltage is greater than the desired maximum voltage.

21. A method of preventing overcharging of a compensation capacitor in an amplifier circuit, comprising:

sensing a node voltage associated with the compensation capacitor;

determining whether the sensed node voltage is within a desired range; and providing compensation to the amplifier according to the sensed voltage if the sensed voltage is outside the desired range, wherein determining whether the sensed node voltage is within a desired range comprises determining whether the sensed node voltage is less than a desired minimum voltage, and wherein providing compensation to the amplifier according to the sensed voltage if the sensed voltage is outside the desired range comprises sourcing current to the node associated with the compensation capacitor if the sensed node voltage is less than the desired minimum voltage.

* * * * *